(12) United States Patent
Tonouchi et al.

(10) Patent No.: US 10,876,000 B2
(45) Date of Patent: Dec. 29, 2020

(54) THERMOSETTING RESIN COMPOSITION, PREPREG, LAMINATED BOARD, PRINTED WIRING BOARD, AND HIGH SPEED COMMUNICATION-COMPATIBLE MODULE

(71) Applicant: HITACHI CHEMICAL COMPANY, LTD., Tokyo (JP)

(72) Inventors: Shunsuke Tonouchi, Tokyo (JP); Tomokazu Shimada, Tokyo (JP); Kazutoshi Danjoubara, Tokyo (JP); Tomio Fukuda, Tokyo (JP); Minoru Kakitani, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 19 days.

(21) Appl. No.: 16/305,930

(22) PCT Filed: May 30, 2017

(86) PCT No.: PCT/JP2017/020043
§ 371 (c)(1),
(2) Date: Nov. 30, 2018

(87) PCT Pub. No.: WO2017/209108
PCT Pub. Date: Dec. 7, 2017

(65) Prior Publication Data
US 2019/0169432 A1 Jun. 6, 2019

(30) Foreign Application Priority Data

Jun. 2, 2016 (JP) .................. 2016-110868

(51) Int. Cl.
| | | |
|---|---|---|
| *C08G 73/02* | (2006.01) | |
| *C08G 73/10* | (2006.01) | |
| *C08L 79/08* | (2006.01) | |
| *C08L 25/08* | (2006.01) | |
| *C08L 35/06* | (2006.01) | |
| *C08L 79/02* | (2006.01) | |
| *C08J 5/24* | (2006.01) | |
| *C08G 73/00* | (2006.01) | |
| *C08L 15/00* | (2006.01) | |
| *H05K 1/03* | (2006.01) | |
| *B32B 15/088* | (2006.01) | |
| *B32B 15/08* | (2006.01) | |
| *B32B 5/28* | (2006.01) | |
| *C08L 79/00* | (2006.01) | |
| *B32B 5/02* | (2006.01) | |
| *B32B 15/14* | (2006.01) | |
| *B32B 15/20* | (2006.01) | |

(52) U.S. Cl.
CPC .............. *C08L 79/02* (2013.01); *B32B 5/02* (2013.01); *B32B 5/28* (2013.01); *B32B 15/08* (2013.01); *B32B 15/088* (2013.01); *B32B 15/14* (2013.01); *B32B 15/20* (2013.01); *C08G 73/00* (2013.01); *C08G 73/0246* (2013.01); *C08J 5/24* (2013.01); *C08L 15/00* (2013.01); *C08L 35/06* (2013.01); *C08L 79/00* (2013.01); *H05K 1/03* (2013.01); *H05K 1/0373* (2013.01); *B32B 2260/046* (2013.01); *C08G 73/028* (2013.01); *C08G 73/0273* (2013.01); *C08G 73/10* (2013.01); *C08J 2379/02* (2013.01); *C08J 2409/06* (2013.01); *C08J 2425/08* (2013.01); *C08L 25/08* (2013.01); *C08L 79/08* (2013.01)

(58) Field of Classification Search
None
See application file for complete search history.

(56) References Cited

U.S. PATENT DOCUMENTS

| | | |
|---|---|---|
| 3,985,928 A | 10/1976 | Watanabe et al. |
| 2013/0330563 A1 | 12/2013 | Kotake et al. |
| 2014/0349090 A1 | 11/2014 | Hsieh |
| 2016/0122521 A1* | 5/2016 | Wang .............. C08F 12/34 524/151 |

FOREIGN PATENT DOCUMENTS

| | | |
|---|---|---|
| CN | 1693352 A | 11/2005 |
| CN | 104177809 A | 12/2014 |
| CN | 105542457 A | 5/2016 |
| JP | 50-153098 A | 12/1975 |
| JP | 61-233060 A | 10/1986 |
| JP | 5-148343 A | 6/1993 |
| JP | 2014-024926 A | 2/2014 |
| WO | 2012/099133 A1 | 7/2012 |

OTHER PUBLICATIONS

Daiwakasei Industry Co., Webpage for "Bismaleimide group—Products", Retrieved from www.daiwakasei.jp on Apr. 7, 2020, (Year: 2020).*
TCI America. Webpage for "Bis(3-ethyl-5-methyl-4-maleinidophenyl)methane", Retrieved from www.tcichemicals.com on Apr. 7, 2020, (Year: 2020).*

* cited by examiner

Primary Examiner — Richard A Huhn
(74) Attorney, Agent, or Firm — Fitch, Even, Tabin & Flannery, LLP

(57) ABSTRACT

A thermosetting resin composition containing: (A) an addition reaction product of a maleimide compound having at least two N-substituted maleimide groups in one molecule (a1) and an amine compound having at least two primary amino groups in one molecule (a2), (B) a thermoplastic elastomer, and (C) a copolymer resin having a structural unit derived from an aromatic vinyl compound and a structural unit derived from a carboxylic acid anhydride.

20 Claims, No Drawings

THERMOSETTING RESIN COMPOSITION, PREPREG, LAMINATED BOARD, PRINTED WIRING BOARD, AND HIGH SPEED COMMUNICATION-COMPATIBLE MODULE

CROSS-REFERENCE TO RELATED APPLICATIONS

This application is a U.S. national phase application filed under 35 U.S.C. § 371 of International Application No. PCT/JP2017/020043, filed May 30, 2017, designating the United States, which claims benefit from Japanese Patent Application 2016-110868, filed Jun. 2, 2016, which are hereby incorporated herein by reference in their entirety.

TECHNICAL FIELD

The present invention relates to a thermosetting resin composition, a prepreg, a laminated board, a printed wiring board, and a high-speed communication-compatible module.

BACKGROUND ART

With a recent trend toward downsizing and technical advancement of electronic devices, advanced high-level and large-scale integration of wiring density in printed wiring boards is being developed, and with that, a demand for reliability improvement such as improvement of heat resistance is increasing for laminated boards for wiring thereon. In such uses, especially in use for semiconductor package substrates, both excellent heat resistance and low thermal expansion are required. In addition, with significant increase in information and communication traffic volume in network infrastructural devices, large-scale computers and others, semiconductor packages to be mounted on these electronic devices have become required to satisfy compatibility with high frequency, and substrate materials having a low dielectric constant and a low dielectric loss tangent and capable of reducing transmission loss are desired.

As laminated boards for printed wiring boards, those produced by curing and integrally molding a prepreg that contains a resin composition containing a main ingredient of an epoxy resin, and a glass cloth are generally used.

An epoxy resin is excellent in balance of insulation quality, heat resistance and cost, but is required to be further improved in order to satisfy more excellent heat resistance and lower thermal expansion required in recent use for semiconductor package substrates. An epoxy resin has a high thermal expansion rate and is therefore attempted to have a low thermal expansion rate by selecting an epoxy resin having an aromatic ring and by adding thereto an inorganic filler such as silica at a high filling rate (for example, see PTL 1). However, it is known that an increase of the filling amount of an inorganic filler causes reduction in insulation reliability, shortage in adhesion between resin and wiring layer, pressure molding failure, and the like, owing to moisture absorption, and lowering of a thermal expansion rate by only increasing the rate of filling an inorganic filler is limitative. Further, in the case where an epoxy resin is used, it is difficult to obtain a cured resin product having good relative permittivity and dielectric loss tangent, and for high-speed communication materials, improvement of dielectric characteristics is desired.

It is known that a modified maleimide resin with a siloxane skeleton introduced into a bismaleimide resin has excellent heat resistance and low thermal expansion without increasing too much the content of an inorganic filler therein (for example, see PTL 2). In addition, the modified maleimide resin has a low relative permittivity and a low dielectric loss tangent as compared with an epoxy resin, but could not still attain a relative permittivity and a dielectric loss tangent that are required recently.

For the purpose of improving dielectric characteristics, a laminated board added with a polybutadiene resin as a thermoplastic elastomer has been investigated. The laminated board has excellent dielectric characteristics but has some drawbacks in that the prepreg for the board is sticky, the compatibility thereof with any other thermosetting resin is low, the shrinkage in curing is large and the adhesiveness to a metal foil such as a copper foil is poor.

As a method of improving these, a method of using a butadiene-vinyl aromatic compound copolymer has been proposed (for example, see PTL 3), but in order to attain a sufficient compatibility with any other thermosetting resin, the copolymerization ratio of the vinyl aromatic compound must be increased and, in such a case, there occurs a problem of reduction in heat resistance.

Recently, warpage caused by the difference in thermal expansion between chips and a substrate in a semiconductor package substrate or caused by cure shrinkage of a substrate therein is discussed as a problem. As a method for avoiding the warpage, a method of reducing the thermal expansion rate of a substrate and reducing the cure shrinkage of a resin is being investigated. As an example of the approach thereto, a method of using both a modified maleimide resin and a thermoplastic elastomer has been proposed (for example, see PTL 4). In PTL 4, a thermoplastic elastomer is applied for the purpose of reducing the cure shrinkage of the resin. Here, when a hydrogenated styrene-based elastomer is used as the thermoplastic elastomer, it exhibits a low relative permittivity and a low dielectric loss tangent since the polarity of the skeleton thereof is extremely low. Consequently, when a modified maleimide resin and a hydrogenated styrene-based elastomer are used in combination, both low thermal expansion and excellent dielectric characteristics (low relative permittivity and low dielectric loss tangent) can be satisfied.

CITATION LIST

Patent Literature

PTL 1: JP 5-148343 A
PTL 2: WO2012/099133
PTL 3: JP 61-233060 A
PTL 4: JP 2014-24926 A

SUMMARY OF INVENTION

Technical Problem

However, the composition containing a modified maleimide resin and a thermoplastic elastomer in combination has no problem in point of general heat resistance, but has a problem in heat resistance under severe conditions for high-density packaging and increased multilayer configuration of recent printed wiring boards, that is, the composition is problematic in that its heat resistance after water absorption is poor. According to the present inventors' investigations, it is considered that the reason would be because the compatibility between the modified maleimide resin and the thermoplastic elastomer may be insufficient.

A subject matter of the present invention is, in consideration of the current situation as above, to provide a thermosetting resin composition having excellent heat resistance, low thermal expansion, low relative permittivity and low dielectric loss tangent, and to provide a prepreg, a laminated board, a printed wiring board and a high-speed communication-compatible module using the composition.

Solution to Problem

The present inventors have assiduously studied for the purpose of attaining the above-mentioned purposes, and, as a result, have found that using a modified maleimide resin having a specific structure, a thermoplastic elastomer and, a copolymer resin formed of raw material monomers of an aromatic vinyl compound and a carboxylic acid anhydride can attain the above-mentioned purposes, and have completed the present invention.

Specifically, the present invention relates to the following [1] to [12].
[1] A thermosetting resin composition containing:
(A) an addition reaction product of a maleimide compound having at least two N-substituted maleimide groups in one molecule (a1) and an amine compound having at least two primary amino groups in one molecule (a2),
(B) a thermoplastic elastomer, and
(C) a copolymer resin having a structural unit derived from an aromatic vinyl compound and a structural unit derived from a carboxylic acid anhydride.
[2] The thermosetting resin composition according to the above [1], wherein the structural unit derived from an aromatic vinyl compound is represented by the following general formula (C-1) and the structural unit derived from a carboxylic acid anhydride is a structural unit derived from a maleic anhydride represented by the following general formula (C-2):

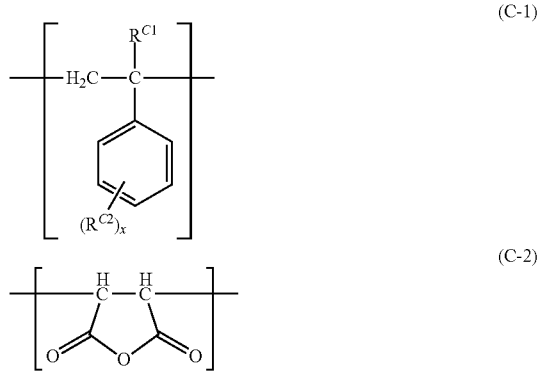

wherein $R^{C1}$ represents a hydrogen atom or an aliphatic hydrocarbon group having 1 to 5 carbon atoms, $R^{C2}$ each independently represents an aliphatic hydrocarbon group having 1 to 5 carbon atoms or an aromatic hydrocarbon group having 6 to 20 carbon atoms, and x represents an integer of 0 to 3.
[3] The thermosetting resin composition according to the above [1] or [2], containing, as the component (C), a copolymer resin wherein $R^{C1}$ is a hydrogen atom and x is 0 in the general formula (C-1) and the content ratio of the structural unit represented by the general formula (C-1) to the structural unit represented by the general formula (C-2) [(C-1)/(C-2)] (by mol) is from 5 to 10.
[4] The thermosetting resin composition according to any of the above [1] to [3], wherein the content of the component (B) is from 4 to 20 parts by mass relative to 100 part by mass of the solid content of the resin component in the thermosetting resin composition, and the content of the component (C) is from 2 to 20 parts by mass relative to 100 part by mass of the solid content of the resin component in the thermosetting resin composition.
[5] The thermosetting resin composition according to any of the above [1] to [4], wherein the component (a2) contains a modified siloxane having an amino group at the end thereof.
[6] The thermosetting resin composition according to any of the above [1] to [5], wherein the thermoplastic elastomer (B) is a hydrogenated styrene-based thermoplastic elastomer, and the content of the structural unit derived from styrene in the hydrogenated styrene-based thermoplastic elastomer is from 20 to 60% by mass.
[7] The thermosetting resin composition according to any of the above [1] to [6], further containing (D) a curing accelerator.
[8] The thermosetting resin composition according to any of the above [1] to [7], further containing (E) an inorganic filler.
[9] A prepreg, which is formed by infiltrating a thermosetting resin composition of any of the above [1] to [8] into a fiber substrate.
[10] A laminated board, which is obtained by subjecting a prepreg of claim 9 to a laminate molding.
[11] A printed wiring board, which is produced using a prepreg of the above [9] or a laminated board of the above [10].
[12] A high-speed communication-compatible module, which is produced using a printed wiring board of the above [11].

Advantageous Effects of Invention

According to the present invention, there are provided a thermosetting resin composition having excellent heat resistance, low thermal expansion, low relative permittivity and low dielectric loss tangent, and a prepreg, a laminated board, a printed wiring board and a high-speed communication-compatible module using the composition.

DESCRIPTION OF EMBODIMENTS

[Thermosetting Resin Composition]
The thermosetting resin composition of the present invention is a thermosetting resin composition containing (A) an addition reaction product of a maleimide compound having at least two N-substituted maleimide groups in one molecule (a1) and an amine compound having at least two primary amino groups in one molecule (a2) (hereinafter also referred to as "(A) modified maleimide resin"), (B) a thermoplastic elastomer, and (C) a copolymer resin having a structural unit derived from an aromatic vinyl compound and a structural unit derived from a carboxylic acid anhydride (hereinafter also referred to as "(C) copolymer resin".
<(A) Modified Maleimide Resin>
The modified maleimide resin (A) is an addition reaction product of a maleimide compound having at least two N-substituted maleimide groups in one molecule (a1) and an amine compound having at least two primary amino groups in one molecule (a2).
(Maleimide Compound Having at Least Two N-Substituted Maleimide Groups in One Molecule (a1))
With no specific limitation, the maleimide compound having at least two N-substituted maleimide groups in one molecule (a1) (hereinafter also referred to as "(a1) component") may be any one having a structure having at least two N-substituted maleimide groups in one molecule, but is preferably a maleimide compound having two N-substituted maleimide groups in one molecule, more preferably a compound represented by the following general formula (a1-1).

(a1-1)

In the formula, $X^{A1}$ represents a group represented by the following general formula (a1-2), (a1-3), (a1-4) or (a1-5).

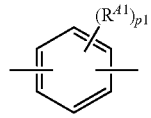
(a1-2)

In the formula, $R^{A1}$ each independently represents an aliphatic hydrocarbon group having 1 to 5 carbon atoms, and p represents an integer of 0 to 4.

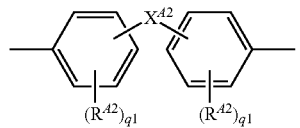
(a1-3)

In the formula, $R^{A2}$ each independently represents an aliphatic hydrocarbon group having 1 to 5 carbon atoms, $X^{A2}$ represents an alkylene group having 1 to 5 carbon atoms, an alkylidene group having 2 to 5 carbon atoms, an ether group, a carbonyloxy group, a keto group, a single bond, or a group represented by the following general formula (a1-3'), and q1 each independently represents an integer of 0 to 4.

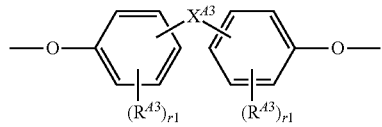
(a1-3')

In the formula, $R^{A3}$ each independently represents an aliphatic hydrocarbon group having 1 to 5 carbon atoms, $X^{A3}$ represents an alkylene group having 1 to 5 carbon atoms, an alkylidene group having 2 to 5 carbon atoms, an ether group, a carbonyloxy group, a keto group, or a single bond, and r1 each independently represents an integer of 0 to 4.

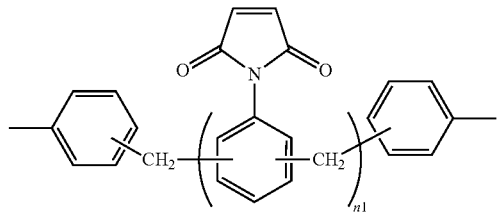
(a1-4)

In the formula, n1 represents an integer of 1 to 10.

(a1-5)

In the formula, $R^{A4}$ each independently represents a hydrogen atom, or an aliphatic hydrocarbon group having 1 to 5 carbon atoms, and u1 represents an integer of 1 to 8.

Examples of the aliphatic hydrocarbon group represented by $R^{A1}$ in the general formula (a1-2) include an alkyl group having 1 to 5 carbon atoms such as a methyl group, an ethyl group, a n-propyl group, an isopropyl group, a n-butyl group, an isobutyl group, a t-butyl group and a n-pentyl group.

Examples of the aliphatic hydrocarbon group having 1 to 5 carbon atoms represented by $R^{A2}$ in the general formula (a1-3) include the same as in the case of $R^{A1}$.

Examples of the alkylene group having 1 to 5 carbon atoms represented by $X^{A2}$ include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $X^{A2}$ include an ethylidene group, a propylidene group, an isopropylidene group, a butylidene group, an isobutylidene group, a pentylidene group, and an isopentylidene group.

Examples of the aliphatic hydrocarbon group having 1 to 5 carbon atoms represented by $R^{A3}$ in the general formula (a1-3') include the same as in the case of $R^{A2}$.

Examples of the alkylene group having 1 to 5 carbon atoms and the alkylidene group having 2 to 5 carbon atoms as represented by $X^{A3}$ include the same as those of the alkylene group having 1 to 5 carbon atoms and the alkylidene group having 2 to 5 carbon atoms as represented by $X^{A2}$.

Examples of the aliphatic hydrocarbon group having 1 to 5 carbon atoms represented by $R^{A4}$ in the general formula (a1-5) include the same as in the case of $R^{A1}$ in the general formula (a1-2).

Examples of the component (a1) include N,N-ethylenebismaleimide, N,N'-hexamethylenebismaleimide, N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimidophenyl)methane, bis(3-methyl-4-maleimidophenyl)methane, 3,3'-dimethyl-5,5'-diethyl-4,4'-diphenylmethanebismaleimide, bis(4-maleimidophenyl) ether, bis(4-maleimidophenyl) ketone, bis(4-maleimidocyclohexyl)methane, 1,4-bis(4-maleimidophenyl)cyclohexane, 1,4-bis(maleimidemethyl)cyclohexane, 1,4-bis(maleimidemethyl)benzene, 1,3-bis(4-maleimidophenoxy)benzene, 1,3-bis(3-maleimidophenoxy)benzene, bis[4-(3-maleimidophenoxy)phenyl]methane, bis[4-(4-maleimidophenoxy)phenyl]methane, 1,1-bis[4-(3-maleimidophenoxy)phenyl]ethane, 1,1-bis[4-(4-maleimidophenoxy)phenyl]ethane, 1,2-bis[4-(3-maleimidophenoxy)phenyl]ethane, 1,2-bis[4-(4-maleimidophenoxy)phenyl]ethane, 2,2-bis[4-(3-maleimidophenoxy)phenyl]propane, 2,2-bis[4-(4-maleimidophenoxy)phenyl]propane, 2,2-bis[4-(3-maleimidophenoxy)phenyl]butane, 2,2-bis[4-(4-maleimidophenoxy)phenyl]butane, 4,4-bis(3-maleimidophenoxy)biphenyl, 4,4-bis(4-maleimidophenoxy)biphenyl, bis[4-(3-maleimidophenoxy)phenyl] ketone, bis [4-(4-maleimidophenoxy)phenyl]ketone, bis[4-(3-maleimidophenoxy)phenyl] ether, and bis[4-(4-maleimidophenoxy)phenyl] ether. For the component (a1), one alone may be used or two or more may be used as a mixture thereof.

Among these, from the viewpoint of excellent solubility in solvent, maleimide compounds having a phenoxy group are preferred, and from the viewpoint of having a high reactivity and capable of realizing higher heat resistance, bis(4-maleimidophenyl)methane and 2,2-bis[4-(4-maleimidophenoxy)phenyl]propane are preferred.

(Amine Compound Having at Least Two Primary Amino Groups in One Molecule (a2))

The amine compound having at least two primary amino groups in one molecule (a2) (hereinafter also referred to as "(a2) component") is preferably an amine compound having two primary amino groups in one molecule, and more preferably a compound represented by the following general formula (a2-1).

$$H_2N—Y^{A1}—NH_2 \quad (a2-1)$$

In the formula, $Y^{A1}$ represents a group represented by the following formula (a2-2), (a2-3) or (a2-4).

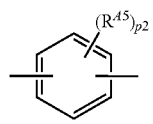
(a2-2)

In the formula, $R^{A5}$ each independently represents an aliphatic hydrocarbon group having 1 to 5 carbon atoms, and p2 represents an integer of 0 to 4.

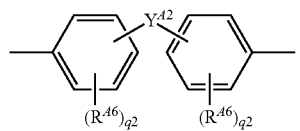
(a2-3)

In the formula, $R^{A6}$ each independently represents an aliphatic hydrocarbon group having 1 to 5 carbon atoms, $Y^{A2}$ represents an alkylene group having 1 to 5 carbon atoms, an alkylidene group having 2 to 5 carbon atoms, an ether group, a carbonyloxy group, a keto group, a single bond, or a group represented by the following general formula (a2-3'), and q2 each independently represents an integer of 0 to 4.

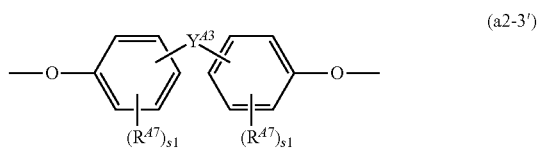
(a2-3')

In the formula, $R^{A7}$ each independently represents an aliphatic hydrocarbon group having 1 to 5 carbon atoms, $Y^{A3}$ represents an alkylene group having 1 to 5 carbon atoms, an alkylidene group having 2 to 5 carbon atoms, an ether group, a carbonyloxy group, a keto group, or a single bond, and s1 each independently represents an integer of 0 to 4.

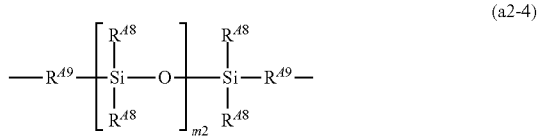
(a2-4)

In the formula, $R^{A8}$ each independently represents an alkyl group having 1 to 5 carbon atoms, a phenyl group or a substituted phenyl group, $R^{A9}$ each independently represents a divalent organic group, and m2 represents an integer of 1 to 100.

Examples of the aliphatic hydrocarbon group represented by $R^{A5}$ in the general formula (a2-2) include an alkyl group having 1 to 5 carbon atoms such as a methyl group, an ethyl group, a n-propyl group, an isopropyl group, a n-butyl group, an isobutyl group, a t-butyl group and a n-pentyl group.

Examples of the aliphatic hydrocarbon group having 1 to 5 carbon atoms represented by $R^{A6}$ in the general formula (a2-3) include the same as in the case of $R^{A5}$.

Examples of the alkylene group having 1 to 5 carbon atoms represented by $Y^{A2}$ include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $Y^{A2}$ include an ethylidene group, a propylidene group, an isopropylidene group, a butylidene group, an isobutylidene group, a pentylidene group, and an isopentylidene group.

Examples of the aliphatic hydrocarbon group having 1 to 5 carbon atoms represented by $R^{A}7$ in the general formula (a2-3') include the same as in the case of $R^{A6}$.

Examples of the alkylene group having 1 to 5 carbon atoms and the alkylidene group having 2 to 5 carbon atoms as represented by $Y^{A3}$ include the same as those of the alkylene group having 1 to 5 carbon atoms and the alkylidene group having 2 to 5 carbon atoms as represented by $Y^{A2}$.

The alkyl group having 1 to 5 carbon atoms represented by $R^{A8}$ in the general formula (a2-4) is more preferably an alkyl group having 1 to 3 carbon atoms. Examples of the alkyl group represented by $R^{A8}$ include a methyl group, an ethyl group, a n-propyl group, an isopropyl group, a n-butyl group, an isobutyl group, a t-butyl group, and a n-pentyl group, and among these, a methyl group is preferred.

Examples of the substituent in the substituted phenyl group represented by $R^{A8}$ include an alkyl group, an alkenyl group, and an alkynyl group, and among these, an alkyl group is preferred. Examples of the alkyl group include the same as those of the alky group represented by $R^{48}$.

Examples of the divalent organic group represented by $R^{49}$ include an alkylene group, an alkylidene group, an alkenylene group, an alkynylene group, an arylene group, —O—, or a divalent linking group formed by combining two or more thereof. Among these, an alkylene group and an arylene group are preferred. Examples of the alkylene group include a methylene group, an ethylene group, and a propylene group. Examples of the arylene group include a phenylene group and a naphthylene group.

Examples of the component (a2) include a modified siloxane having an amino group at the end thereof, diaminobenzidine, diaminodiphenylmethane, 3,3'-diethyl-4,4'-diaminodiphenylmethane, diaminodiphenyl ether, 3,3'-dimethoxy-4,4'-diaminobiphenyl, 3,3'-dimethyl-4,4'-diaminodiphenyl, 1,3'-bis(4-aminophenoxy)benzene, 2,2'-bis[4-(4-aminophenoxy)phenyl]propane, 4,4'-bis(4-aminophenoxy)biphenyl, 1,4'-bis(4-aminophenoxy)benzene, 2,2'-dimethyl-4,4'-diaminobiphenyl, and 4,4'-diamino-3,3'-biphenyldiol. For the component (a2), one alone may be used or two or more may be used as a mixture thereof.

Among these, from the viewpoint of realizing high elasticity and high heat resistance, 3,3'-diethyl-4,4'-diaminodiphenyl methane and 2,2'-bis[4-(4-aminophenoxy)phenyl] propane are preferred.

From the viewpoint of low thermal expansion, a modified siloxane having an amino group at the end thereof is preferred. As the modified siloxane having an amino group at the end thereof, commercial products may be used. Examples of the commercial products include "X-22-161A" (functional group equivalent weight, 800 g/mol), "X-22-161B" (functional group equivalent weight, 1,500 g/mol) (both by Shin-Etsu Chemical Co., Ltd.), "BY16-853U" (functional group equivalent weight, 460 g/mol) (by Toray Dow Corning Corporation) and "XF42-C5379" (functional group equivalent weight, 750 g/mol) (by Momentive Performance Materials Japan Corporation) each having an amino group at both ends thereof.

Preferably, from the viewpoint of satisfying all of low thermal expansion, high elasticity and high heat resistance, the component (a2) contains a modified siloxane having an amino group at the end thereof, and an amine group except such a modified siloxane having an amino group at the end thereof, and more preferably contains a modified siloxane having an amino group at the end thereof and one or more selected from the group consisting of 3,3'-diethyl-4,4'-diaminodiphenylmethane and 2,2'-bis[4-(4-aminophenoxy)phenyl]propane in combination.

In the case where the component (a2) contains a modified siloxane having an amino group at the end thereof and an amine compound except such a modified siloxane having an amino group at the end thereof in combination, the ratio by weight thereof [modified siloxane having an amino group at the end thereof/amine compound except such a modified siloxane having an amino group at the end thereof] is preferably 3/97 to 90/10, more preferably 10/90 to 80/20, even more preferably 20/80 to 70/30.

Examples of the modified maleimide resin (A) of an addition reaction product of the component (a1) and the component (a2) include those having a structural unit represented by the following general formula (A-1).

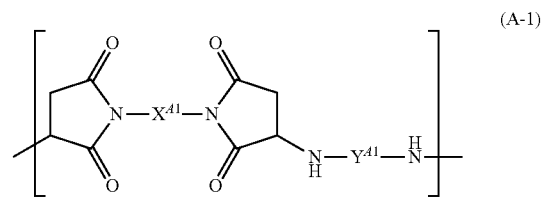

In the formula, $X^{41}$ has the same meaning as that of $X^{41}$ in the above-mentioned general formula (a1-1), and $Y^{41}$ has the same meaning as that of $Y^{41}$ in the above-mentioned general formula (a2-1).

(Method for Producing Modified Maleimide Resin (A))

The modified maleimide resin (A) may be produced through addition reaction of the component (a1) and the component (a2).

Regarding the blend ratio of the component (a1) and the component (a2) in the addition reaction, from the viewpoint of gelling prevention and heat resistance, the equivalent weight of the maleimide group in the component (a1) preferably falls within a range larger than the equivalent weight of the primary amino group in the component (a2), and preferably, the ratio by equivalent of the maleimide group in the component (a1) to the primary amino group in the component (a2) [component (a1)/component (a2)] is 2 to 15, more preferably 3 to 10.

The reaction temperature in the addition reaction is, from the viewpoint of productivity and uniform reaction progress, preferably 70 to 150° C., more preferably 100 to 130° C. The reaction time is preferably 0.1 to 10 hours, more preferably 1 to 6 hours.

Preferably, the addition reaction is carried out in an organic solvent. Examples of the organic solvent include an alcohol solvent such as ethanol, propanol, and propylene glycol monomethyl ether; acetone solvent such as methyl ethyl ketone, methyl isobutyl ketone, and cyclohexanone; an ester solvent such as ethyl acetate; an aromatic solvent such as toluene; and a nitrogen atom-containing solvent such a dimethylacetamide, and N-methylpyrrolidone. As the solvent, one alone may be used or two or more may be used as a mixture thereof.

Among these, from the viewpoint of solubility, cyclohexanone, propylene glycol monomethyl ether, methyl cellosolve and γ-butyrolactone are preferred, and from the viewpoint of low toxicity and high volatility to leave little residual solvent, cyclohexanone and propylene glycol monomethyl ether are preferred.

The amount of the solvent to be used is, from the viewpoint of solubility and reaction speed, preferably 25 to 1,000 parts by mass relative to 100 parts by mass of the total of the component (a1) and the component (a2), more preferably 50 to 500 parts by mass.

The content of the modified maleimide resin (A) in the thermosetting resin composition of the present invention is preferably 50 to 95 parts by mass relative to 100 parts by mass of the solid content of the resin component in the thermosetting resin composition, more preferably 60 to 90 parts by mass, even more preferably 70 to 87 parts by mass.

In this description, the "solid content" means a non-volatile content excepting a volatile substance such as solvent, and indicates a component not to evaporate but to remain in the resin composition when the resin composition is dried, and includes those that are liquid, syrup-like or waxy at room temperature. Here in this description, room temperature is 25° C.

The "resin component" is a resin or a component used for production of a resin, except the inorganic filler to be mentioned below, and specifically, the modified maleimide resin (A), the thermoplastic elastomer (B) and the copolymer resin (C) correspond to the resin component.

The content of the modified maleimide resin (A) in the thermosetting resin composition of the present invention is, from the viewpoint of elasticity and low thermal expansion, preferably such that the amount of the component (a1) of the raw material to be calculated from the amount of the modified maleimide resin (A) in the thermosetting resin composition could be 30 to 90 parts by mass relative to 100 parts by mass of the solid content of the resin component in the thermosetting resin composition, more preferably 50 to 85 parts by mass.

Also the content of the modified maleimide resin (A) in the thermosetting resin composition of the present invention is, from the viewpoint of good low thermal expansion and adhesiveness to copper foil, preferably such that the amount of the component (a2) of the raw material to be calculated from the amount of the modified maleimide resin (A) in the thermosetting resin composition could be 3 to 50 parts by mass relative to 100 parts by mass of the solid content of the resin component in the thermosetting resin composition, more preferably 5 to 40 parts by mass.

<(B) Thermoplastic Elastomer>

With no specific limitation, the thermoplastic elastomer (B) (hereinafter also referred to as "component (B)") may be appropriately selected from heretofore known thermoplastic elastomers. However, in the present invention, the thermoplastic elastomer (B) is defined as those except for the copolymer resin (C) containing a structural unit derived from an aromatic vinyl compound and a structural unit derived from a carboxylic acid anhydride to be described hereinunder.

Examples of the thermoplastic elastomer (B) include a styrene-based elastomer, an olefin-based elastomer, an urethane-based elastomer, a polyester-based elastomer, a polyamide-based elastomer, an acryl-based elastomer, a silicone-based elastomer and derivatives thereof. For the component (B), one alone may be used, or two or more may be used as a mixture thereof.

As the thermoplastic elastomer (B), one having a reactive functional group at the molecular end or in the molecular chain may also be used. Examples of the reactive functional group include an epoxy group, a hydroxy group, a carboxy group, an amino group, an amide group, an isocyanate group, an acryl group, a methacryl group, and a vinyl group. Having such a reactive functional group at the molecular end or in the molecular chain, the compatibility of the elastomer may improve to enhance the heat resistance of substrates.

Among these reactive functional groups, from the viewpoint of adhesiveness to metal foil and from the viewpoint of heat resistance and insulation reliability, more preferably, the elastomer has any of a carboxy group, an amino group and a hydroxy group.

From the viewpoint of compatibility with a modified polyimide resin, the thermoplastic elastomer (B) is preferably a styrene-butadiene copolymer, or a styrene-isoprene copolymer, and from the viewpoint of dielectric characteristics, a hydrogenated styrene-based thermoplastic elastomer such as a hydrogenated styrene-butadiene copolymer resin or a hydrogenated styrene-isoprene copolymer resin, which is produced by hydrogenating the double bond moiety in the above-mentioned copolymer, is more preferred.

Further, the content of the structural unit derived from styrene (hereinafter also referred to as "styrene amount") in the hydrogenated styrene-based thermoplastic elastomer is preferably 20 to 60% by mass, more preferably 25 to 55% by mass. Using a hydrogenated styrene-based thermoplastic elastomer such as a hydrogenated styrene-butadiene copolymer resin or a hydrogenated styrene-isoprene copolymer resin having a styrene amount of 20 to 60% by mass, as the thermoplastic elastomer (B), a resin excellent not only in wet heat resistance but also in appearance of prepreg after coating to prevent the prepreg from being chalky can be attained. When the styrene content is 60% by mass or less, the substrate characteristics (thermal expansion rate, dielectric characteristics, heat resistance) are good and, in addition, prepreg formed by coating tends to hardly cause cracking on the appearance thereof. This may be considered to be because styrene stacking cohesion could be suppressed and resin flexibility may be excellent. When the styrene amount is 20% by mass or more, the substrate characteristics (thermal expansion rate, dielectric characteristics, heat resistance) are also good and, in addition, the compatibility between the modified maleimide resin (A) and the thermoplastic elastomer (B) is excellent and a chalky resin amount may be small, and therefore the resin composition tends to have good handleability. This may be considered to be because, since the structure of the maleimide group that the modified maleimide resin (A) has is closer to that of styrene as compared with the structure of butadiene or isoprene, the compatibility between the modified maleimide resin (A) and the styrene skeleton is excellent in the case where the styrene amount in the thermoplastic elastomer (B) is 20% by mass or more.

As the styrene-based elastomer, commercial products may be used. Examples of the commercial products include "Tuftec (registered trademark) H1051", "Tuftec (registered trademark) H1053", "Tuftec (registered trademark) M1911", "Tuftec (registered trademark) M1913" (all by Asahi Kasei Chemicals Corporation), "Septon (registered trademark) 2002" and "Septon (registered trademark) HG252" (both by Kuraray Corporation).

The content of the thermoplastic elastomer (B) in the thermosetting resin composition is preferably 4 to 20 parts by mass relative to 100 parts by mass of the solid content of the resin component in the thermosetting resin composition, more preferably 6 to 15 parts by mass. When the content of the thermoplastic elastomer (B) is 4 parts by mass or more, the effect of realizing low permittivity can be sufficiently attained, and when the content is 20 parts by mass or less, the thermoplastic elastomer (B) is well miscible in resin to sufficiently disperse therein, and the resultant composition can be excellent in heat resistance and peel strength.

<(C) Copolymer Resin>

The copolymer resin (C) is a copolymer resin containing a structural unit derived from an aromatic vinyl compound and a structural unit derived from a carboxylic acid anhydride.

The thermosetting resin composition of the present invention contains the copolymer resin (C) and therefore exhibits the effect thereof excellent in heat resistance after water absorption. Though not clear, the reason of exhibiting the effect would be as follows.

Heretofore, for the purpose of improving dielectric characteristics, a method of adding a thermoplastic elastomer to a modified maleimide resin has been employed, in which, however, the thermoplastic elastomer significantly differs from the modified maleimide resin in point of the skeletons between them, and are therefore hardly compatible with each other. Consequently, when a modified maleimide resin and a thermoplastic elastomer are merely blended, the resultant blend is problematic in point of heat resistance under severe conditions required these days (for example, after moisture absorption treatment in pressure cooker).

The copolymer resin (C) that the thermosetting resin composition of the present invention contains has a structural unit derived from an aromatic vinyl compound and a structural unit derived from a carboxylic acid anhydride, in which the structural unit derived from an aromatic vinyl compound is excellent in compatibility with a thermoplastic elastomer (especially, styrene-containing elastomer) and the structural unit derived from a carboxylic acid anhydride is excellent in compatibility with a modified maleimide resin. Consequently, the copolymer resin (C) functions as a compatibilizer for the modified maleimide resin (A) and the thermoplastic elastomer (B), and accordingly, the compatibility between the modified maleimide resin (A) and the thermoplastic elastomer (B) may be thereby improved and the heat resistance of the resin composition may be thereby also improved. Further, the copolymer resin (C) itself also has excellent dielectric characteristics, and therefore may impart excellent heat resistance to the resin composition without detracting from the dielectric characteristics thereof.

The structural unit derived from an aromatic vinyl compound in the copolymer resin (C) is preferably a structural unit represented by the following general formula (C-1). Examples of the structural unit derived from a carboxylic acid anhydride in the component (C) include a structural unit derived from maleic anhydride, a structural unit derived from phthalic anhydride, and a structural unit derived from succinic anhydride. Especially from the viewpoint of compatibility with the modified maleimide resin (A), a structural unit derived from maleic anhydride represented by the following general formula (C-2), whose structure is similar to that of a maleimide group, is preferred.

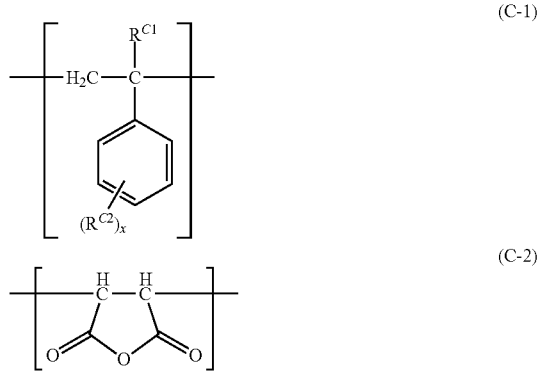

In the formulae, $R^{C1}$ represents a hydrogen atom, or an aliphatic hydrocarbon group having 1 to 5 carbon atoms, $R^{C2}$ each independently represents an aliphatic hydrocarbon group having 1 to 5 carbon atoms, or an aromatic hydrocarbon group having 6 to 20 carbon atoms, and x represents an integer of 0 to 3.

Examples of the aliphatic hydrocarbon group having 1 to 5 carbon atoms represented by $R^{C1}$ or $R^{C2}$ include a methyl group, an ethyl group, a n-propyl group, an isopropyl group, a n-butyl group, an isobutyl group, a t-butyl group and a n-pentyl group. Among these, from the viewpoint of adhesiveness to copper foil and dielectric characteristics, an aliphatic hydrocarbon group having 1 to 3 carbon atoms is preferred, and a methyl group and an ethyl group are more preferred.

Examples of the aromatic hydrocarbon group having 6 to 20 carbon atoms represented by $R^{C2}$ include a phenyl group, a naphthyl group, an anthryl group and a biphenylyl group.

The structural unit represented by the general formula (C-1) is preferably a structural unit represented by the following general formula (C-1'), which has a hydrogen atom as $R^{C1}$ and 0 as x.

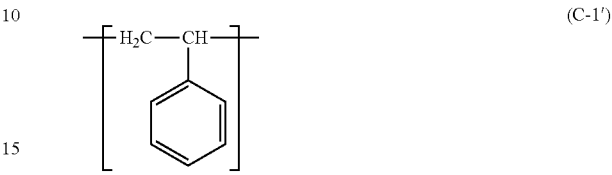

The content ratio of the structural unit represented by the general formula (C-1) to the structural unit represented by the general formula (C-2) in the copolymer resin (C) [(C-1)/(C-2)] (by mol) is preferably 2 to 12, more preferably 5 to 10. When the content ratio is 2 or more, the effect of improving dielectric characteristics and heat resistance tends to be sufficient, and when the ratio is 12 or less, the compatibility tends to better. Further, when [(C-1)/(C-2)] (by mol) is 5 to 10, the resin composition can realize good substrate characteristics and, in addition thereto, since the content of the styrene-derived structural unit excellent in compatibility with the thermoplastic elastomer (B) may fall within a preferred range, the compatibility between the modified maleimide resin (A) and the thermoplastic elastomer (B) can improve more and the prepreg to be formed has little chalking.

The total content of the structural unit represented by the general formula (C-1) and the structural unit represented by the general formula (C-2) in the copolymer resin (C) is preferably 50% by mass or more, more preferably 70% by mass or more, even more preferably 90% by mass or more, and especially preferably the content is substantially 100% by mass.

The copolymer resin (C) may be produced through copolymerization of an aromatic vinyl compound and a carboxylic acid anhydride. Examples of the aromatic vinyl compound include styrene, 1-methylstyrene, and vinyltoluene. One alone of these may be used or two or more may be used as a mixture thereof.

Further, other various polymerizable components than the aromatic vinyl compound and the carboxylic acid anhydride may also be copolymerized. Examples of the other various polymerizable components include vinyl compounds such as ethylene, propylene and butadiene.

As the copolymer resin (C), commercial products may be used. Examples of the commercial products include "SMA (registered trademark) EF30" (styrene/maleic anhydride (ratio by mol)=3, Mw=9,500), "SMA (registered trademark) EF40" (styrene/maleic anhydride (ratio by mol)=4, Mw=11,000), "SMA (registered trademark) EF60" (styrene/maleic anhydride (ratio by mol)=6, Mw=11,500), and "SMA (registered trademark) EF80" (styrene/maleic anhydride (ratio by mol)=8, Mw=14,400) (all by Sartomer Corporation). Among these, "SMA (registered trademark) EF60" and "SMA-EF80" are preferred.

The content of the copolymer resin (C) in the thermosetting resin composition is preferably 2 to 20 parts by mass relative to 100 parts by mass of the solid content of the resin component in the thermosetting resin composition, more preferably 3 to 15 parts by mass, even more preferably 4 to 13 parts by mass. When the content of the copolymer resin (C) is 2 parts by mass or more, the effect of realizing low permittivity can be sufficiently attained, and when the content is 20 parts by mass or less, the copolymer resin (C) is excellent in dispersibility and the resultant composition can be excellent in heat resistance and peel strength.

<(D) Curing Accelerator>

From the viewpoint of accelerating curing reaction, the thermosetting resin composition of the present invention may further contain (D) a curing accelerator.

Examples of the curing accelerator (D) include organic phosphorus compounds such as triphenyl phosphine; imidazoles and derivatives thereof; nitrogen-containing compounds such as secondary amines, tertiary amines and quaternary ammonium salts; organic peroxides such as dicumyl peroxide, 2,5-dimethyl-2,5-bis(t-butylperoxy)hexyne-3, 2,5-dimethyl-2,5-bis(t-butylperoxy)hexane, and α,α'-bis(t-butylperoxy)diisopropylbenzene; and organic metal salts such as zinc naphthenate, cobalt naphthenate, tin octylate, and cobalt octylate. For the curing accelerator (D), one alone may be used or two or more may be used as a mixture thereof.

In the case where the thermosetting resin composition of the present invention contains the curing accelerator (D), the content thereof is preferably 0.1 to 5 parts by mass relative to 100 parts by mass of the solid content of the resin component in the thermosetting resin composition, more preferably 0.3 to 2 parts by mass.

<(E) Inorganic Filler>

The thermosetting resin composition of the present invention may further contain (E) an inorganic filler.

Examples of the inorganic filler (E) include silica, alumina, titanium oxide, mica, barium titanate, strontium titanate, aluminum carbonate, magnesium hydroxide, aluminum hydroxide, calcium carbonate, silicon nitride, boron nitride, talc, silicon carbide, quartz powder, glass short fiber, glass fine powder, and hollow glass. As the glass, preferred are E glass, T glass and D glass. For the inorganic filler (E), one alone may be used or two or more may be used as a mixture thereof.

Among these, from the viewpoint of dielectric characteristics, heat resistance and low thermal expansion, silica is preferred. Examples of silica include precipitated silica having a high water content produced in a wet process, and a dry-process silica containing little bound water produced in a dry process. The dry-process silica may be further classified into crushed silica, fumed silica and fused spherical silica, depending on the production method thereof. Among these, fused spherical silica is preferred from the viewpoint of the low thermal expansion and the flowability thereof in charging in resin.

The mean particle size of the inorganic filler (E) is preferably 0.1 to 10 μm, more preferably 0.3 to 8 μm. When the mean particle size is 0.1 μm or more, the flowability of the filler in charging in resin can be kept good, and when the size is 10 μm or less, the mixing probability of coarse particles can be reduced and occurrence of failure to be caused by coarse particles can be prevented. Here, the mean particle size means a particle size at the point corresponding to 50% volume on a cumulative frequency distribution curve of particle size where the total volume of the particles is 100%, and can be measured using a particle sizer according to a laser diffraction scattering method.

The inorganic filler (E) may be surface-treated with a coupling agent. The surface treatment method with a coupling agent may be a method of surface-treating the inorganic filler (E) before blending according to a dry process or a wet process, or a so-called integral blending method where the inorganic filler (E) before surface treatment is blended with other component to give a composition and then a silane coupling agent is added to the composition.

Examples of the coupling agent include a silane coupling agent, a titanate coupling agent and a silicone oligomer.

In the case where thermosetting resin composition of the present invention contains the inorganic filler (E), the content thereof is preferably 10 to 300 parts by mass relative to 100 parts by mass of the solid content of the resin component in the thermosetting resin composition, more preferably 50 to 250 parts by mass. When the content of the inorganic filler (E) falls within the above range, moldability and low thermal expansion may better.

In the case where the thermosetting resin composition of the present invention contains the inorganic filler (E), preferably, the composition may be processed with a disperser such as a three-roll mill, a bead mill or a nanomizer to thereby improve the dispersibility of the inorganic filler (E), as needed.

<Other Components>

The modified maleimide resin (A) in the present invention is a thermosetting resin, and may have good thermosetting performance by itself, but if desired, the resin may be combined with any other thermosetting resin to improve adhesiveness and mechanical strength thereof.

Not specifically limited, examples of the thermosetting resin to be combined include an epoxy resin, a phenolic resin, a cyanate resin, an isocyanate resin, a benzoxazine resin, an allyl resin, a dicyclopentadiene resin, a silicone resin, and a triazine resin. One alone of these may be used or two or more thereof may be used as a mixture. Among these, from the viewpoint of moldability and electric insulation, a cyanate resin and a benzoxazine resin are preferred.

Containing an epoxy resin, the resin composition can exhibit good adhesiveness, but the content thereof is preferably 2% by mass or less in the solid content of the thermosetting resin composition. When the content of the epoxy resin is 2% by mass or less, dielectric characteristics and storage stability can be kept excellent.

The thermosetting rein composition of the present invention may optionally contain any known organic filler, flame retardant, UV absorbent, antioxidant, photopolymerization initiator, fluorescent whitener, and adhesiveness improver.

Examples of the organic filler include a resin filler of polyethylene or polypropylene resin, and a resin filler having a core-shell structure.

Examples of the flame retardant include a phosphorus flame retardant such as an aromatic phosphate compound, a phosphazene compound, a phosphinate, a metal salt of a phosphinic acid compound, red phosphorus, 9,10-dihydro-9-oxa-10-phosphaphenanthrene-10-oxide and derivatives thereof; a nitrogen flame retardant such as melamine sulfate, and melamine polyphosphate; and an inorganic flame retardant such as antimony trioxide.

Examples of the UV absorbent include a benzotriazole UV absorbent.

Examples of the antioxidant include a hindered phenol antioxidant, and a hindered amine antioxidant.

Examples of the photopolymerization initiator include benzophenones, benzyl ketals, and thioxanthone-based photopolymerization initiators.

Examples of the fluorescent whitener include a stilbene derivative fluorescent whitener.

Examples of the adhesiveness improver include urea compounds such as urea silane, and the above-mentioned coupling agents.

The thermosetting resin composition may be in the form of a varnish where the constituent components are dissolved or dispersed in an organic solvent, for use for production of prepreg and others.

Examples of the organic solvent to be used for the varnish include an alcohol solvent such as ethanol, propanol, propylene glycol monomethyl ether; a ketone solvent such as methyl ethyl ketone, methyl isobutyl ketone, and cyclohexanone; an ester solvent such as ethyl acetate; an aromatic solvent such as toluene and xylene; and a nitrogen atom-containing solvent such as dimethylacetamide and N-methylpyrrolidone. One alone of these solvents may be used or two or more thereof may be used as a mixture.

Among these, from the viewpoint of solubility, propylene glycol monomethyl ether, methyl ethyl ketone, methyl isobutyl ketone, cyclohexanone and toluene are preferred, and from the viewpoint of low toxicity, propylene glycol monomethyl ether, methyl isobutyl ketone, cyclohexanone and toluene are more preferred.

The solid concentration in the varnish is preferably 40 to 90% by mass, more preferably 50 to 80% by mass. When the solid concentration in the varnish falls within the above range, coatability can be kept good, and a prepreg having a suitable resin composition deposit can be obtained.

[Prepreg]

The prepreg of the present invention is one produced by infiltrating the thermosetting resin composition of the present invention into a fiber substrate.

The prepreg of the present invention may be produced by infiltrating the thermosetting resin composition of the present invention into a fiber substrate followed by semicuring it by heating or the like (for conversion into B-stage).

As the fiber substrate, any well-known one that is used in laminates for various electric insulating materials can be used. Examples of the material include inorganic fibers of E glass, S glass, low-dielectric glass or Q glass; organic fibers of low-dielectric glass polyimide, polyester or tetrafluoroethylene; and mixtures thereof.

These fiber substrates have various shapes of, for example, woven fabric, nonwoven fabric, roving, chopped strand mat or surfacing mat. The material and the shape can be selected depending on the use and the performance of the intended molded article, and one alone or, as needed, two or more kinds of materials and shapes can be used either singly or as combined. The thickness of the fiber substrate for use herein may be, for example, about 0.03 to 0.5 mm. Preferably, the fiber substrate is surface-treated with a silane coupling agent or the like, or is mechanically opened from the viewpoint of heat resistance, moisture resistance and processability.

The prepreg of the present invention may be produced, for example, by infiltrating the thermosetting resin composition of the present invention into a fiber substrate in such a manner that the deposit of the thermosetting resin composition on the fiber substrate could be 20 to 90% by mass (the content of thermosetting resin composition in the prepreg), followed by semi-curing it by hot-drying at a temperature of generally 100 to 200° C. for 1 to 30 minutes (for conversion into B-stage).

[Laminated Board]

The laminated board of the present invention is one produced by laminate-molding the prepreg of the present invention.

The laminated board of the present invention may be produced, for example, by layering 1 to 20 sheets of the prepreg of the present invention, and then laminate-molding them in such a configuration that a metal foil of copper, aluminum or the like is arranged on one surface or both surfaces of the resultant laminate. With no specific limitation, the metal foil may be any one for use for electric insulating materials.

Regarding the molding condition for the laminated board, any known method for laminates and multilayer plates for electric insulating materials may be employed, in which a multistage press, a multistage vacuum press, a continuous molding machine or an autoclave molding machine may be used for molding under a condition of a temperature of 100 to 250° C., a pressure of 0.2 to 10 MPa, and a heating time of 0.1 to 5 hours. Combining the prepreg of the present invention with a printed wiring board for an inner layer, the resultant may be subjected to a laminate molding to produce a laminated board.

[Printed Wiring Board]

The printed wiring board of the present invention is one produced using the prepreg or the laminated board of the present invention.

The printed wiring board of the present invention can be produced, for example, by forming a circuit on the surface of the laminated board of the present invention. A conductor layer of the laminated board of the present invention may be etched in an ordinary manner for wiring on the board, and a plurality of the wiring-formed laminates may be layered via a prepreg arranged therebetween, and then hot-pressed to produce a multilayered board. Subsequently, the board may be drilled or laser-worked to form through-holes or blind via-holes therethrough, and then further worked for interlayer wiring thereon by plating or using a conductive paste to give a multilayer printed wiring board.

[High-Speed Communication-Compatible Module]

The high-speed communication-compatible module of the present invention is a high-speed communication-compatible module produced using the printed wiring board of the present invention.

The high-speed communication-compatible module of the present invention is, for example, a communication module produced by mounting semiconductor chips and others on the printed wiring board of the present invention, and is especially favorable for use where high-frequency zone signals are used and where the information communication amount is large and the speed is high, such as use for wireless communication devices and network infrastructure devices.

EXAMPLES

Next, the present invention is described in more detail with reference to Examples given hereinunder, but these Examples are not whatsoever intended to restrict the present invention.

The thermosetting resin compositions and the copper-clad laminates obtained in Examples were evaluated as follows.

(1) Glass Transition Temperature (Tg)

The copper-clad laminate was immersed in a copper etchant to remove the copper foil, thereby preparing an evaluation substrate having a 5 mm square. Using a TMA tester "Q400" (trade name by TA Instruments Corporation), the evaluation substrate was thermomechanically analyzed according to a compression method. The evaluation substrate was attached to the tester in the X-direction, and then analyzed continuously twice under the condition at a heating rate of 10° C./min under a load of 5 g. On the thermal expansion curve at the 2nd measurement, an intersection point of different tangent lines was read to be the glass transition temperature (Tg) of the laminate.

(2) Thermal Expansion Rate

The copper-clad laminate was immersed in a copper etchant to remove the copper foil, thereby preparing an evaluation substrate having a 5 mm square. Using a TMA tester "Q400" (trade name by TA Instruments Corporation), the evaluation substrate was thermomechanically analyzed according to a compression method. The evaluation substrate was attached to the tester in the X-direction, and then analyzed continuously twice under the condition at a heating rate of 10° C./min under a load of 5 g. The average thermal expansion rate from 30° C. to 100° C. at the 2nd measurement was calculated to be a value of the thermal expansion rate of the laminate.

(3) Dielectric Characteristics (Relative Permittivity and Dielectric Loss Tangent)

The copper-clad laminate was immersed in a copper etchant to remove the copper foil, thereby preparing an evaluation substrate of 100 mm×2 mm. Using a cavity resonator (by Kanto Electronic Application and Development Inc.), the relative permittivity and the dielectric loss tangent of the sample at a frequency of 10 GHz were measured.

(4) Copper Clad Soldering Heat Resistance

The copper-clad laminate was cut into an evaluation substrate having a 25 mm square. The evaluation substrate was kept floating in a soldering bath at a temperature of 288° C. for at most 60 minutes, and while the appearance thereof was observed, the time taken before swelling was measured. Regarding the evaluation results, the samples not confirmed to have swollen in floating for 60 minutes were expressed as ">60" in Table 1.

(5) Soldering Heat Resistance after Water Absorption of Substrate Having a Copper Clad on One Surface The copper-clad laminate was cut into a size of 50 mm square. One surface alone of the sample was kept copper-clad while the other surface thereof was immersed in a copper etchant to remove copper from the entire surface, thereby preparing an evaluation substrate having a copper clad on one surface and a square of 50 mm. In a pressure cooker tester (PCT) (by Hirayama Manufacturing Corporation) (condition: 121° C., 2.2 atmospheres), the evaluation substrate having a copper clad on one surface was processed for 5 hours, then immersed in a soldering bath at 288° C. for 20 seconds, and the appearance thereof was visually observed to evaluate the soldering heat resistance after water absorption of the evaluation substrate having a copper clad on one surface. Regarding the evaluation results, the samples not confirmed to have swollen in the test were expressed as "A", and those confirmed to have swollen were expressed as "B" in Table 1.

(6) Prepreg Appearance after Coating

The produced varnish was applied to a glass cloth by immersion, and then heated and dried at 160° C. for 5 minutes. The resultant prepreg was checked for presence or absence of cracking on the surface thereof. Cracks having a definite unevenness of 1 mm or more in width were checked for in the presence or absence of cracking. Regarding the evaluation results, the samples with no cracking were expressed as "A", and those with cracking were expressed as "B" in Table 1.

(7) Prepreg Chalking Resistance

The prepreg was cut into a size of 250 mm square, then folded at 180 degrees in such a manner that the diagonal lines could overlap, and restored to the original state. Regarding the evaluation results, the samples with no resin chalking during this treatment were expressed as "A" and those with visually-observed resin chalking were expressed as "B" in Table 1.

Production Example 1: [Production of Modified Maleimide Resin (A-1)]

In a heatable and coolable reactor having a capacity of 2 liters and equipped with a thermometer, a stirring unit and a moisture-determining unit with a reflux condenser tube, 15.9 g of a both-end diamine-modified siloxane (trade name, X-22-161A by Shin-Etsu Chemical Co., Ltd.), 28.6 g of 3,3'-diethyl-4,4'-diaminodiphenylmethane (trade name, KAYAHARD (registered trademark) A-A by Nippon Kayaku Co., Ltd.), 280.5 g of bis(4-maleimidophenyl)methane (trade name, BMI by K.I Chemical Industry Co., Ltd.), and 200.0 g of propylene glycol monomethyl ether were put, and reacted under reflux at 126° C. for 5 hours to give a solution of a modified maleimide resin (A-1).

Production Example 2: [Production of Modified Maleimide Resin (A-2)]

In a heatable and coolable reactor having a capacity of 2 liters and equipped with a thermometer, a stirring unit and a moisture-determining unit with a reflux condenser tube, 14.4 g of a both-end diamine-modified siloxane (trade name, X-22-161B by Shin-Etsu Chemical Co., Ltd.), 56.9 g of 2,2'-bis[4-(4-aminophenoxy)phenyl]propane (trade name, BAPP by Wakayama Seika Kogyo Co., Ltd.), 253.7 g of bis(4-maleimidophenyl)methane (trade name, BMI by K.I Chemical Industry Co., Ltd.), and 200.0 g of propylene glycol monomethyl ether were put, and reacted under reflux at 126° C. for 5 hours to give a solution of a modified maleimide resin (A-2).

Production Example 3: [Production of Modified Maleimide Resin (A-3)]

In a heatable and coolable reactor having a capacity of 2 liters and equipped with a thermometer, a stirring unit and a moisture-determining unit with a reflux condenser tube, 15.6 g of a both-end diamine-modified siloxane (trade name, X-22-161B by Shin-Etsu Chemical Co., Ltd.), 21.8 g of 3,3'-diethyl-4,4'-diaminodiphenylmethane (trade name, KAYAHARD (registered trademark) A-A by Nippon Kayaku Co., Ltd.), 274.2 g of 2,2-bis[4-(4-maleimidophenoxy)phenyl]propane (trade name, BMI-4000 by Daiwa Kasei Industry Co., Ltd.), and 200.0 g of propylene glycol monomethyl ether were put, and reacted at 120° C. for 4 hours to give a solution of a modified maleimide resin (A-3).

Production Example 4: [Production of Modified Maleimide Resin (A-4)]

In a heatable and coolable reactor having a capacity of 2 liters and equipped with a thermometer, a stirring unit and a moisture-determining unit with a reflux condenser tube, 16.6 g of a both-end diamine-modified siloxane (trade name, X-22-161A by Shin-Etsu Chemical Co., Ltd.), 25.5 g of 2,2'-bis[4-(4-aminophenoxy)phenyl]propane (trade name, BAPP by Wakayama Seika Kogyo Co., Ltd.), 292.6 g of 2,2-bis[4-(4-maleimidophenoxy)phenyl]propane (trade name, BMI-4000 by Daiwa Kasei Industry Co., Ltd.), and 200.0 g of propylene glycol monomethyl ether were put, and reacted under reflux at 126° C. for 6 hours to give a solution of a modified maleimide resin (A-4).

Examples 1 to 10 and Comparative Examples 1 to 5

According to the blending ratio shown in Table 1 (the numerical value in the Table is in terms of part by mass of the solid content, and in the case of a solution (excepting organic solvent) or a dispersion, the numerical value is a solid-equivalent amount), a composition was formulated and blended, and using methyl ethyl ketone and toluene as solvents, this was formed into a varnish having a solid concentration of 65% by mass.

Next, the varnish was applied to an E glass cloth having a thickness of 0.1 mm (by Nitto Boseki Co., Ltd.) by immersion, and then heated and dried at 160° C. for 5 minutes to prepare a prepreg in which the content of the thermosetting resin composition was 46% by mass.

Four prepregs were layered, a 12-m electrolytic copper foil was arranged on both sides thereof, and pressed under a pressure of 2.5 MPa at a temperature of 200° C. for 90 minutes to prepare a copper-clad laminate. The evaluation results of the resultant copper-clad laminate are shown in Table 1.

The components used for blending are shown below.
[(A) Modified Maleimide Resin]
Modified maleimide resin (A-1): modified maleimide resin (A-1) prepared in Production Example 1
Modified maleimide resin (A-2): modified maleimide resin (A-2) prepared in Production Example 2
Modified maleimide resin (A-3): modified maleimide resin (A-3) prepared in Production Example 3
Modified maleimide resin (A-4): modified maleimide resin (A-4) prepared in Production Example 4
[(B) Thermoplastic Elastomer]
Tuftec H1051: hydrogenated styrene-butadiene copolymer resin (styrene amount: 42% by mass) (by Asahi Kasei Chemicals Corporation)
Tuftec H1053: hydrogenated styrene-butadiene copolymer resin (styrene amount: 29% by mass) (by Asahi Kasei Chemicals Corporation)
Tuftec M1913: carboxylic acid-modified hydrogenated styrene-butadiene copolymer resin (styrene amount: 30% by mass) (by Asahi Kasei Chemicals Corporation)
Septon 2002: hydrogenated styrene-isoprene copolymer resin (styrene amount: 30% by mass) (by Kuraray Corporation)
Septon HG252: hydroxy group-modified hydrogenated styrene-isoprene copolymer resin (styrene amount: 28% by mass) (by Kuraray Corporation)
Septon 2063: hydrogenated styrene-isoprene copolymer resin (styrene amount: 13% by mass) (by Kuraray Corporation)
Tuftec H1043: hydrogenated styrene-butadiene copolymer resin (styrene amount: 67% by mass) (by Asahi Kasei Chemicals Corporation)
[(C) Copolymer Resin Having Structural Unit Derived from Aromatic Vinyl Compound and Structural Unit Derived from Carboxylic Acid Anhydride]
SMA-EF80: copolymer of styrene and maleic anhydride (styrene/maleic anhydride (by mol)=8) (by Sartomer Corporation)
SMA-EF40: copolymer of styrene and maleic anhydride (styrene/maleic anhydride (by mol)=4) (by Sartomer Corporation)
[(D) Curing Accelerator]
TPP-MK: tetraphenylphosphonium tetra-p-tolyl borate (by Hokko Chemical Industry Co., Ltd.)
Perbutyl-P: α,α'-bis(t-butylperoxy)-diisopropylbenzene (by NOF Corporation)
2E4MZ: 2-ethyl-4-methylimidazole (by Shikoku Chemicals Corporation)
2E4MZ-A: 2,4-diamino-6-[2'-ethyl-4'-methylimidazolyl-(1')]-ethyl-s-triazine (by Shikoku Chemicals Corporation)
[(E) Inorganic Filler]
SC2050-KNK: spherical fused silica surface-treated with phenylaminosilane (by Admatechs Corporation, mean particle size: 0.5 μm)

TABLE 1

| | | Example | | | | |
|---|---|---|---|---|---|---|
| | | 1 | 2 | 3 | 4 | 5 |
| (A) Modified Maleimide Resin | Modified maleimide resin (A-1) | 80 | | | | |
| | Modified maleimide resin (A-2) | | 80 | | | |
| | Modified maleimide resin (A-3) | | | 80 | | 80 |
| | Modified maleimide resin (A-4) | | | | 80 | |
| (B) Thermoplastic Elastomer | Tuftec H1051 (styrene amount: 42% by mass) | 10 | | | 12 | |
| | Tuftec H1053 (styrene amount: 29% by mass) | | 10 | | | 8 |
| | Tuftec M1913 (styrene amount: 30% by mass) | | | | | |
| | Septon 2002 (styrene amount: 30% by mass) | | | | | |
| | Septon HG252 (styrene amount: 28% by mass) | | | 10 | | |
| | Septon 2063 (styrene amount: 13% by mass) | | | | | |
| | Tuftec H1043 (styrene amount: 67% by mass) | | | | | |
| (C) Copolymer Resin | SMA-EF80 | 10 | 10 | 10 | 8 | 12 |
| | SMA-EF40 | | | | | |
| (D) Curing Accelerator | TPP-MK | 0.3 | | 0.3 | 0.3 | 0.3 |
| | Perbutyl P | | 0.5 | | | |
| | 2E4MZ | 0.3 | 0.3 | | 0.3 | |
| | 2E4MZ-A | | | 0.3 | | 0.3 |
| (E) Inorganic Filler | SC2050-KNK | 100 | 100 | 100 | 100 | 100 |
| Properties of Laminated Board | (1) Glass transition temperature (° C.) | 257 | 254 | 261 | 258 | 261 |
| | (2) Thermal expansion rate (ppm/° C.) | 9.6 | 9.7 | 9.5 | 9.7 | 9.6 |
| | (3) Dielectric characteristics Relative permittivity (—) | 4.12 | 4.13 | 4.12 | 4.10 | 4.13 |
| | Dielectric loss tangent (—) | 0.0059 | 0.0060 | 0.0058 | 0.0057 | 0.0059 |
| | (4) Copper-clad soldering heat resistance (min) | >60 | >60 | >60 | >60 | >60 |
| | (5) Soldering heat resistance after water absorption of substrate having a copper clad on one surface | A | A | A | A | A |

TABLE 1-continued

|  |  | | | | | |
|---|---|---|---|---|---|---|
| | (6) Prepreg appearance after coating | A | A | A | A | A |
| | (7) Prepreg chalking resistance | A | A | A | A | A |

| | | Example | | | | |
|---|---|---|---|---|---|---|
| | | 6 | 7 | 8 | 9 | 10 |
| (A) Modified Maleimide Resin | Modified maleimide resin (A-1) | 80 | 80 | | | |
| | Modified maleimide resin (A-2) | | | | | 80 |
| | Modified maleimide resin (A-3) | | | | 80 | |
| | Modified maleimide resin (A-4) | | | 80 | | |
| (B) Thermoplastic Elastomer | Tuftec H1051 (styrene amount: 42% by mass) | | | | | |
| | Tuftec H1053 (styrene amount: 29% by mass) | | | | | |
| | Tuftec M1913 (styrene amount: 30% by mass) | 10 | | | | |
| | Septon 2002 (styrene amount: 30% by mass) | | 10 | | | 10 |
| | Septon HG252 (styrene amount: 28% by mass) | | | 10 | | |
| | Septon 2063 (styrene amount: 13% by mass) | | | | 10 | |
| | Tuftec H1043 (styrene amount: 67% by mass) | | | | | |
| (C) Copolymer Resin | SMA-EF80 | 10 | 10 | 10 | 10 | |
| | SMA-EF40 | | | | | 10 |
| (D) Curing Accelerator | TPP-MK | | 0.3 | 0.3 | 0.3 | |
| | Perbutyl P | 0.5 | | | | 0.5 |
| | 2E4MZ | 0.3 | | 0.3 | | 0.3 |
| | 2E4MZ-A | | 0.3 | | 0.3 | |
| (E) Inorganic Filler | SC2050-KNK | 100 | 100 | 100 | 100 | 100 |
| Properties of Laminated Board | (1) Glass transition temperature (° C.) | 254 | 258 | 256 | 261 | 256 |
| | (2) Thermal expansion rate (ppm/° C.) | 9.4 | 9.2 | 9.6 | 9.5 | 9.6 |
| | (3) Dielectric characteristics — Relative permittivity (—) | 4.11 | 4.12 | 4.12 | 4.11 | 4.13 |
| | Dielectric loss tangent (—) | 0.0058 | 0.0058 | 0.0058 | 0.0057 | 0.0058 |
| | (4) Copper-clad soldering heat resistance (min) | >60 | >60 | >60 | >60 | >60 |
| | (5) Soldering heat resistance after water absorption of substrate having a copper clad on one surface | A | A | A | A | A |
| | (6) Prepreg appearance after coating | A | A | A | B | A |
| | (7) Prepreg chalking resistance | A | A | B | A | B |

| | | Comparative Example | | | | |
|---|---|---|---|---|---|---|
| | | 1 | 2 | 3 | 4 | 5 |
| (A) Modified Maleimide Resin | Modified maleimide resin (A-1) | 80 | | | | 82 |
| | Modified maleimide resin (A-2) | | | | | |
| | Modified maleimide resin (A-3) | | | 100 | | |
| | Modified maleimide resin (A-4) | | 80 | | 90 | |
| (B) Thermoplastic Elastomer | Tuftec H1051 (styrene amount: 42% by mass) | 20 | | | | |
| | Tuftec H1053 (styrene amount: 29% by mass) | | | | | |
| | Tuftec M1913 (styrene amount: 30% by mass) | | 20 | | | |
| | Septon 2002 (styrene amount: 30% by mass) | | | | | |
| | Septon HG252 (styrene amount: 28% by mass) | | | | | |
| | Septon 2063 (styrene amount: 13% by mass) | | | | | |
| | Tuftec H1043 (styrene amount: 67% by mass) | | | | | 18 |
| (C) Copolymer Resin | SMA-EF80 | | | | 10 | |
| | SMA-EF40 | | | | | |
| (D) Curing Accelerator | TPP-MK | 0.3 | 0.3 | 0.3 | | |
| | Perbutyl P | | | | 0.5 | 0.5 |
| | 2E4MZ | | 0.3 | | 0.3 | 0.3 |
| | 2E4MZ-A | 0.3 | | 0.3 | | |
| (E) Inorganic Filler | SC2050-KNK | 100 | 100 | 100 | 100 | 100 |
| Properties of Laminated Board | (1) Glass transition temperature (° C.) | 261 | 258 | 264 | 255 | 253 |
| | (2) Thermal expansion rate (ppm/° C.) | 9.3 | 9.4 | 8.9 | 9.6 | 9.7 |
| | (3) Dielectric characteristics — Relative permittivity (—) | 3.98 | 4.01 | 4.41 | 4.36 | 4.11 |
| | Dielectric loss tangent (—) | 0.0054 | 0.0055 | 0.0088 | 0.0084 | 0.0057 |
| | (4) Copper-clad soldering heat resistance (min) | 47 | >60 | >60 | >60 | >60 |
| | (5) Soldering heat resistance after water absorption of substrate having a copper clad on one surface | B | B | A | A | B |
| | (6) Prepreg appearance after coating | A | A | A | A | B |
| | (7) Prepreg chalking resistance | A | A | A | A | A |

As obvious from Table 1, the laminated boards obtained in Examples 1 to 10 are all excellent in all of glass transition temperature, thermal expansion rate, dielectric characteristics, copper-clad soldering heat resistance, and soldering heat resistance after water absorption of a substrate having a copper clad on one surface. On the other hand, the laminated boards of Comparative Examples 1 to 5 are poor in the characteristics of any of dielectric characteristics or soldering heat resistance after water absorption of a substrate having a copper clad on one surface.

Further, as obvious from Table 1, the laminated boards obtained in Examples 1 to 7 are excellent also in prepreg appearance after coating and prepreg chalking resistance, in addition to excellence in glass transition temperature, thermal expansion rate, dielectric characteristics, copper-clad soldering heat resistance, and soldering heat resistance after water absorption of a substrate having a copper clad on one surface.

INDUSTRIAL APPLICABILITY

The printed wiring board obtained using the thermosetting resin composition of the present invention has a high glass transition temperature, a low thermal expansion rate, low dielectric characteristics and high heat resistance, and is therefore useful as a printed wiring board for high-integration semiconductor packages and high-speed communication-compatible electronic devices.

The invention claimed is:

1. A thermosetting resin composition comprising:
   (A) an addition reaction product of a maleimide compound having at least two N-substituted maleimide groups in one molecule (a1) and an amine compound having at least two primary amino groups in one molecule (a2), wherein the component (a2) contains a modified siloxane having an amino group at the end thereof,
   (B) a thermoplastic elastomer, and
   (C) a copolymer resin having a structural unit derived from an aromatic vinyl compound and a structural unit derived from a carboxylic acid anhydride.

2. The thermosetting resin composition according to claim 1, wherein the structural unit derived from an aromatic vinyl compound is represented by the following general formula (C-1) and the structural unit derived from a carboxylic acid anhydride is a structural unit derived from a maleic anhydride represented by the following general formula (C-2):

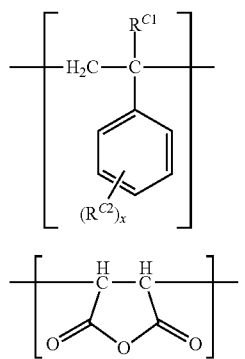

wherein $R^{C1}$ represents a hydrogen atom or an aliphatic hydrocarbon group having 1 to 5 carbon atoms, $R^{C2}$ each independently represents an aliphatic hydrocarbon group having 1 to 5 carbon atoms or an aromatic hydrocarbon group having 6 to 20 carbon atoms, and x represents an integer of 0 to 3.

3. The thermosetting resin composition according to claim 2, comprising, as the component (C), a copolymer resin wherein $R^{C1}$ is a hydrogen atom and x is 0 in the general formula (C-1) and the content ratio of the structural unit represented by the general formula (C-1) to the structural unit represented by the general formula (C-2) [(C-1)/(C-2)] (by mol) is from 5 to 10.

4. The thermosetting resin composition according to claim 1, wherein the content of the component (B) is from 4 to 20 parts by mass relative to 100 part by mass of the solid content of the resin component in the thermosetting resin composition, and the content of the component (C) is from 2 to 20 parts by mass relative to 100 part by mass of the solid content of the resin component in the thermosetting resin composition.

5. The thermosetting resin composition according to claim 1, wherein the component (B) is a hydrogenated styrene-based thermoplastic elastomer, and the content of the structural unit derived from styrene in the hydrogenated styrene-based thermoplastic elastomer is from 20 to 60% by mass.

6. The thermosetting resin composition according to claim 1, further comprising (D) a curing accelerator.

7. The thermosetting resin composition according to claim 1, further comprising (E) an inorganic filler.

8. A prepreg, which is formed by infiltrating a thermosetting resin composition of claim 1 into a fiber substrate.

9. A laminated board, which is obtained by subjecting a prepreg of claim 8 to a laminate molding.

10. A printed wiring board, which is produced using the prepreg of claim 8.

11. A communication module, which is produced using a printed wiring board of claim 10.

12. A printed wiring board, which is produced using the thermosetting resin composition of claim 1.

13. A communication module, which is produced using a printed wiring board of claim 12.

14. A thermosetting resin composition, comprising:
   (A) an addition reaction product of a maleimide compound having at least two N-substituted maleimide groups in one molecule (a1) and an amine compound having at least two primary amino groups in one molecule (a2),
   (B) a thermoplastic elastomer, and
   (C) a copolymer resin having a structural unit derived from an aromatic vinyl compound and a structural unit derived from a carboxylic acid anhydride, wherein the structural unit derived from an aromatic vinyl compound is represented by the following general formula (C-1) and the structural unit derived from a carboxylic acid anhydride is a structural unit derived from a maleic anhydride represented by the following general formula (C-2):

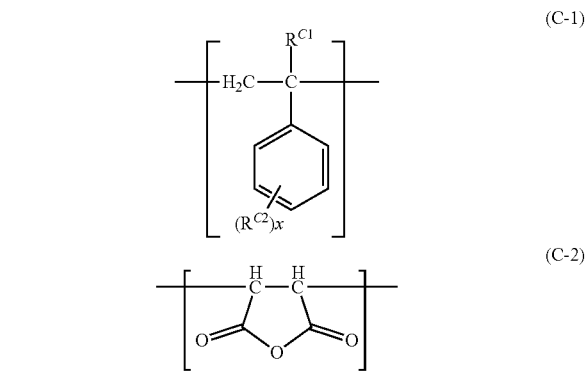

wherein $R^{C1}$ is a hydrogen atom and x is 0 in the general formula (C-1) and the content ratio of the structural unit represented by the general formula (C-1) to the structural unit represented by the general formula (C-2) [(C-1)/(C-2)] (by mol) is from 5 to 10.

15. A prepreg, which is formed by infiltrating a thermosetting resin composition of claim 14 into a fiber substrate.

16. A printed wiring board, which is produced using the prepreg of claim 15.

17. A thermosetting resin composition comprising:
(A) an addition reaction product of a maleimide compound having at least two N-substituted maleimide groups in one molecule (a1) and an amine compound having at least two primary amino groups in one molecule (a2),
(B) a thermoplastic elastomer, wherein the component (B) is a hydrogenated styrene-based thermoplastic elastomer, and the content of the structural unit derived from styrene in the hydrogenated styrene-based thermoplastic elastomer is from 20 to 60% by mass, and
(C) a copolymer resin having a structural unit derived from an aromatic vinyl compound and a structural unit derived from a carboxylic acid anhydride.

18. A prepreg, which is formed by infiltrating a thermosetting resin composition of claim 17 into a fiber substrate.

19. A printed wiring board, which is produced using the prepreg of claim 18.

20. A communication module, which is produced using a printed wiring board of claim 19.

* * * * *